United States Patent [19]

Nakano

[11] Patent Number: 5,387,828
[45] Date of Patent: Feb. 7, 1995

[54] HIGH-SPEED LEVEL SHIFTER WITH SIMPLE CIRCUIT ARRANGEMENT

[75] Inventor: Fumio Nakano, Tokyo, Japan

[73] Assignee: NEC Corporation, Tokyo, Japan

[21] Appl. No.: 161,753

[22] Filed: Dec. 3, 1993

[30] Foreign Application Priority Data

Dec. 4, 1992 [JP] Japan .................. 4-325117

[51] Int. Cl.⁶ .......................... H03K 19/0175
[52] U.S. Cl. ............................ 326/68; 326/121
[58] Field of Search ............ 307/475, 443, 451, 455

[56] References Cited

U.S. PATENT DOCUMENTS

| | | | |
|---|---|---|---|
| 4,161,663 | 7/1979 | Martinez | 307/264 |
| 4,575,648 | 3/1986 | Lee | 307/451 |
| 4,845,381 | 7/1989 | Cuevas | 307/475 |
| 5,068,551 | 11/1991 | Bosnyak | 307/475 |
| 5,089,722 | 2/1992 | Amedeo | 307/475 |
| 5,153,465 | 10/1992 | Sandhu | 307/475 |

OTHER PUBLICATIONS

Chappell et al., "Fast CMOS ECL Receivers With 100-mV Worst-Case Sensitivity" IEEE Journal of Solid State Circuits, vol. 23, No. 1, Feb. (1988).

*Primary Examiner*—Edward P. Westin
*Assistant Examiner*—Andrew Sanders

[57] ABSTRACT

A level shifter has a preliminary level shifting circuit and a final level shifting circuit for stepwise changing a voltage range from complementary input signals to complementary output signals, and the preliminary level shifting circuit comprises two complementary inverters coupled between a constant voltage source and a pair of input nodes and controlled by the complementary input signals so that the number of component transistors is decreased.

5 Claims, 4 Drawing Sheets

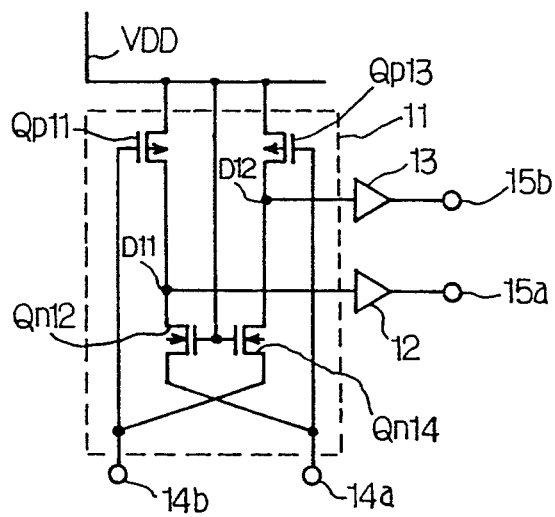
Fig. 3
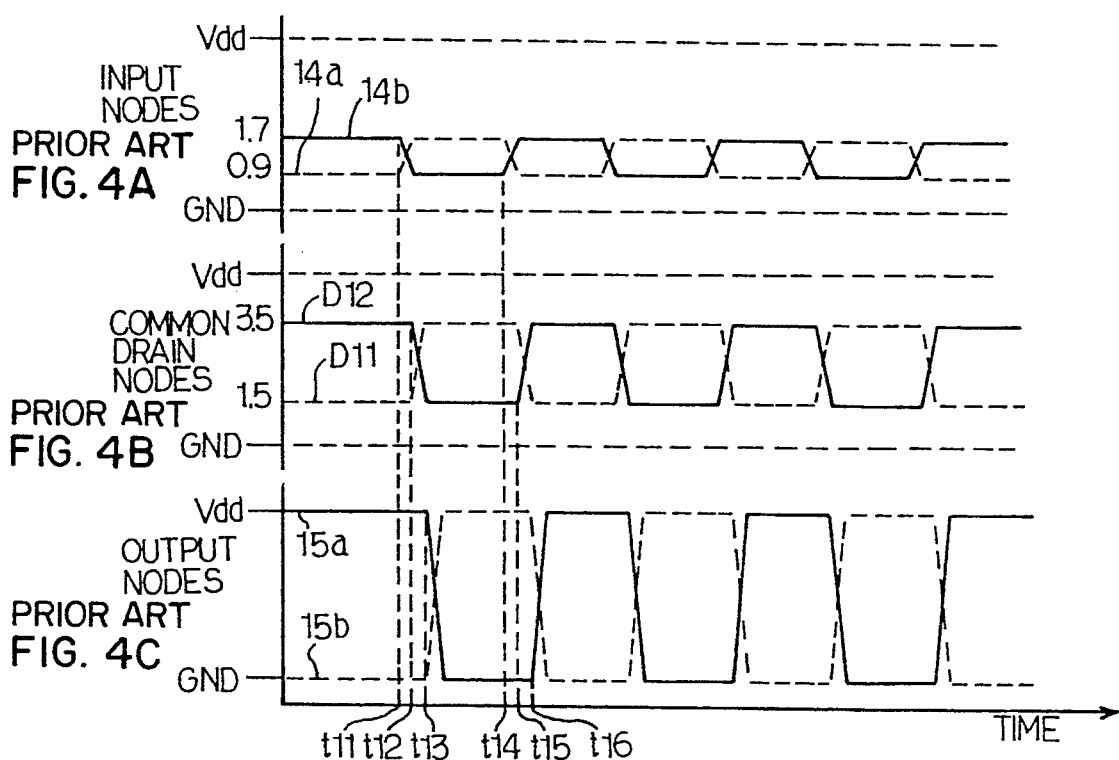

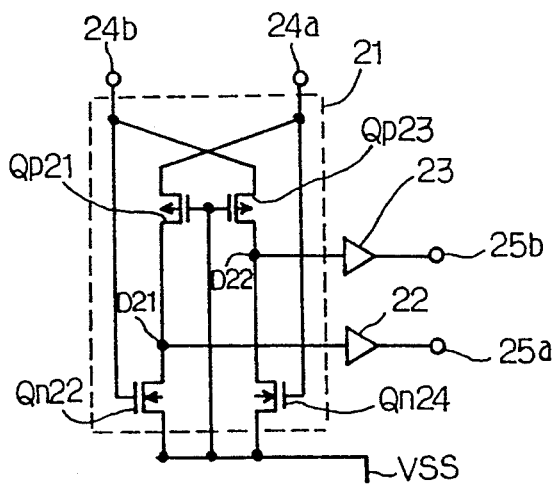
Fig. 5
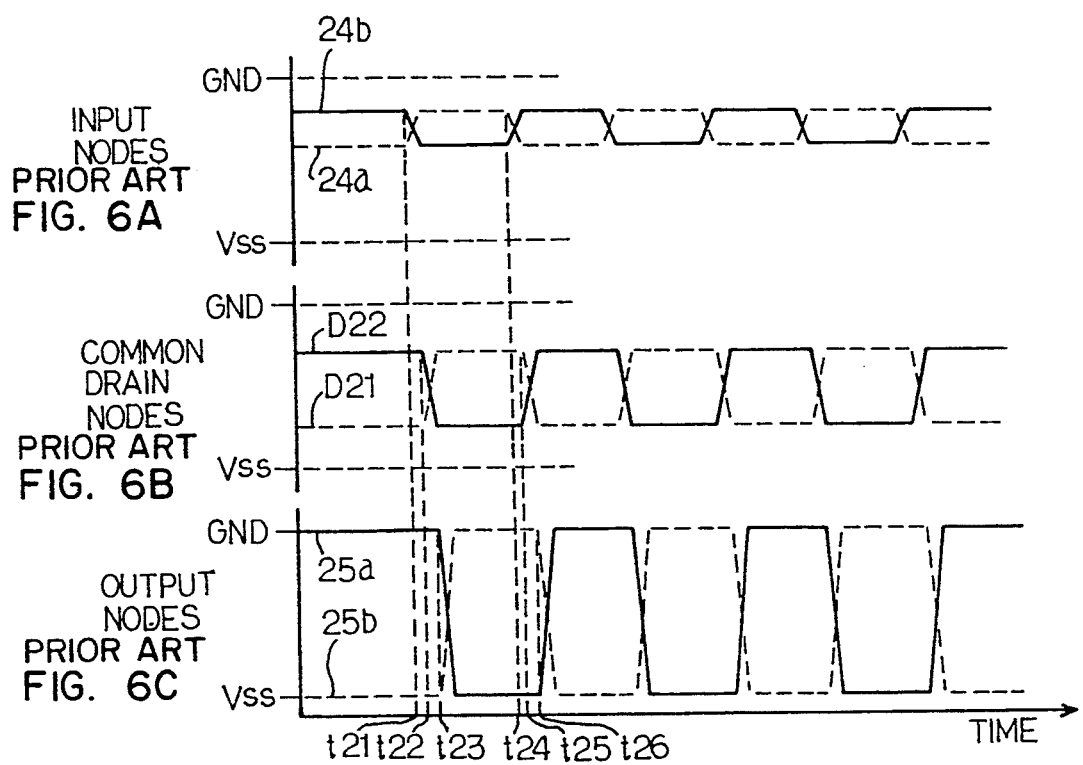
INPUT NODES PRIOR ART
FIG. 6A
COMMON DRAIN NODES PRIOR ART
FIG. 6B
OUTPUT NODES PRIOR ART
FIG. 6C

HIGH-SPEED LEVEL SHIFTER WITH SIMPLE CIRCUIT ARRANGEMENT

FIELD OF THE INVENTION

This invention relates to a level-shifter and, more particularly, to a high-speed level-shifter for producing an input signal of a complementary inverter circuit.

DESCRIPTION OF THE RELATED ART

A typical example of the level-shift circuit is illustrated in FIG. 1 of the drawings, and changes complementary input signals at a pair of input nodes 1a and 1b to complementary output signals at a pair of output nodes 2a and 2b different in voltage range. The complementary input signals swings their voltage levels between 0.9 volt and 1.7 volts, and the complementary output signals alter their voltage levels between the group voltage level and 5 volts. Therefore, the complementary output signals are appropriate for a complementary inverter circuit.

The prior-art level-shifter largely comprises two single-end level shifting circuits 3 and 4. The single-end level shifting circuit 3 comprises series combinations of p-channel enhancement type field effect transistors Qp1/Qp2 and n-channel enhancement type field effect transistors Qn3/ Qn4 coupled between a positive power voltage line VDD and the input nodes 1b and 1a. The common drain node D1 between the p-channel enhancement type field effect transistor Qp1 and the n-channel enhancement type field effect transistor Qn3 is shared between the gate electrodes of the n-channel enhancement type field effect transistors Qn3 and Qn4, and the other common drain node D2 is coupled through a complementary inverter 5 with the output node 2a.

The other single-end level shifting circuit 4 is similarly arranged to the single-end level shifting circuit 3, and comprises series combinations of p-channel enhancement type field effect transistors Qp5/Qp6 and n-channel enhancement type field effect transistors Qn7/Qn8 coupled between the positive power voltage line VDD and the input nodes 1a and 1b. The common drain node D3 between the p-channel enhancement type field effect transistor Qp5 and the n-channel enhancement type field effect transistor Qn7 is shared between the gate electrodes of the n-channel enhancement type field effect transistors Qn7 and Qn8, and the other common drain node D4 is coupled through a complementary inverter 6 with the output node 2b.

Though not shown in FIG. 1, the complementary inverters 5 and 6 are connected between the positive power voltage line VDD and the ground voltage line, and complementarily supply a positive power voltage level Vdd and the ground voltage level GND to the pair of output nodes 2a and 2b. Each of the complementary inverters 5 and 6 is implemented by a series combination of a p-channel enhancement type switching transistor and an n-channel enhancement type switching transistor.

Description is hereinbelow made on the circuit behavior of the prior-art level shifter-with reference to FIG. 2 of the drawings. Assuming now that the input nodes 1a and 1b start to complementarily decay and rise at time t1, the p-channel enhancement type field effect transistor Qp1 increases the channel resistance thereof, and the p-channel enhancement type field effect transistor Qp2 decreases the channel resistance thereof. The p-channel enhancement type field effect transistors Qp1 and Qp2 start the common drain nodes D1 and D2 to rise and decay at time t2, and the common drain node D1 decreases the channel resistances of the n-channel enhancement type field effect transistors Qn3 and Qn4. As a result, the common drain node D2 becomes lower than the threshold level of the inverter 5, and the inverter 5 starts the output node 2a to rise at time t3.

On the other hand, the input nodes 1a decreases the channel resistance of the p-channel enhancement type field effect transistor Qp6, and input node 1b increases the channel resistance of the p-channel enhancement type field effect transistor Qp5. The p-channel enhancement type field effect transistors Qp6 and Qp5 start the common drain nodes D4 and D3 to rise and decay at time t2, and the common drain node D3 increases the channel resistances of the n-channel enhancement type field effect transistors Qn7 and Qn8. As a result, the common drain node. D4 exceeds the threshold level of the inverter 6, and the inverter 6 starts the output node 2b to decay at time t3.

On the contrary, if the input nodes 1a and 1b start to complementarily rise and decay at time t4, the p-channel enhancement type field effect transistor Qp1 decreases the channel resistance thereof, and the p-channel enhancement type field effect transistor Qp2 increases the channel resistance thereof. The p-channel enhancement type field effect transistors Qp1 and Qp2 start the common drain nodes D1 and D2 to decay and rise at time t5, and the common drain node D1 increases the channel resistances of the n-channel enhancement type field effect transistors Qn3 and Qn4. As a result, the common drain node D2 exceeds the threshold level of the inverter 5, and the inverter 5 starts the output node 2a to decay at time t6.

On the other hand, the input nodes 1a increases the channel resistance of the p-channel enhancement type field effect transistor Qp6, and input node 1b decreases the channel resistance of the p-channel enhancement type field effect transistor Qp5. The p-channel enhancement type field effect transistors Qp6 and Qp5 start the common drain nodes D4 and D3 to decay and rise at time t5, and the common drain node D3 decreases the channel resistances of the n-channel enhancement type field effect transistors Qn7 and Qn8. As a result, the common drain node D4 becomes lower than the threshold level of the inverter 6, and the inverter 6 starts the output node 2b to rise at time t6.

Thus, the single-end level shifting circuits 3 and 4 complementarily push and pull the output nodes 2a and 2b, and shifts the voltage range from 0.9–1.7 volts to 5.0–0 volt.

The prior art level shifter thus arranged requires twelve field effect transistors, and the first problem inherent in the prior art level shifter is the large number of circuit components.

Another problem is derived from the large number of circuit components, and is a large amount of current consumption passing through the four current paths of the single-end level shifters 3 and 4.

SUMMARY OF THE INVENTION

It is therefore an important object of the present invention to provide a level shifter which is constructed from a small number of circuit components.

To accomplish the object, it is proposed to use a pair of common nodes of a single level shifting circuit for controlling a pair of complementary inverters.

In accordance with the present invention, there is provided a level shifter for producing complementary output signals from complementary input signals different in voltage range from the complementary output signals comprising; input nodes paired with each other and applied with the complementary input signals; output nodes paired with each other for producing the complementary output signals; a series combination of a first transistor of a first channel conductivity type, a first common node and a second transistor of a second channel conductivity type having a current path between a constant voltage source and one of the input nodes, the first channel conductivity type being opposite to the second channel conductivity type, the first transistor having a gate node connected with the other of the input nodes, the second transistor having a gate node connected with the constant voltage source; a series combination of a third transistor of the first channel conductivity type, a second common node and a fourth transistor of the second channel conductivity type having a current path between the constant voltage source and the other of the input nodes, the third transistor having a gate node connected with the aforesaid one of the input nodes, the fourth transistor having a gate node connected with the constant voltage source; and a final voltage shifting circuit connected at input nodes thereof with the first and second common nodes and at output nodes thereof with the pair of output nodes.

BRIEF DESCRIPTION OF THE DRAWINGS

The features and advantages of the level shifter according to the present invention will be more clearly understood from the following description taken in conjunction with the accompanying drawings in which:

FIG. 3 is a circuit diagram showing the arrangement of a level shifter according to the present invention;

FIG. 4 is a graph showing the waveforms of signals at essential nodes of the level shifter according to the present invention;

FIG. 5 is a circuit diagram showing the arrangement of another level shifter according to the present invention; and FIG. 6 is a graph showing the waveforms of signals at essential nodes of the level shifter shown in FIG. 5.

Figure 1:
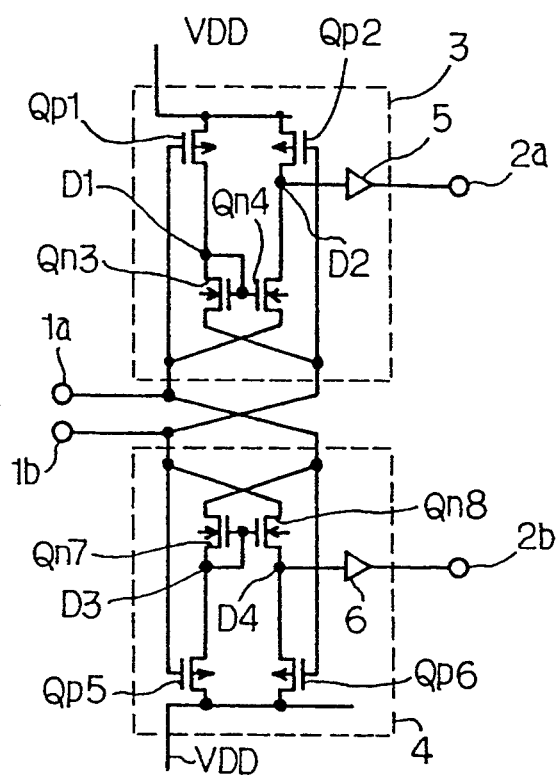
FIG. 1 is a circuit diagram showing the arrangement of the prior art level shifter.
Figure 2:
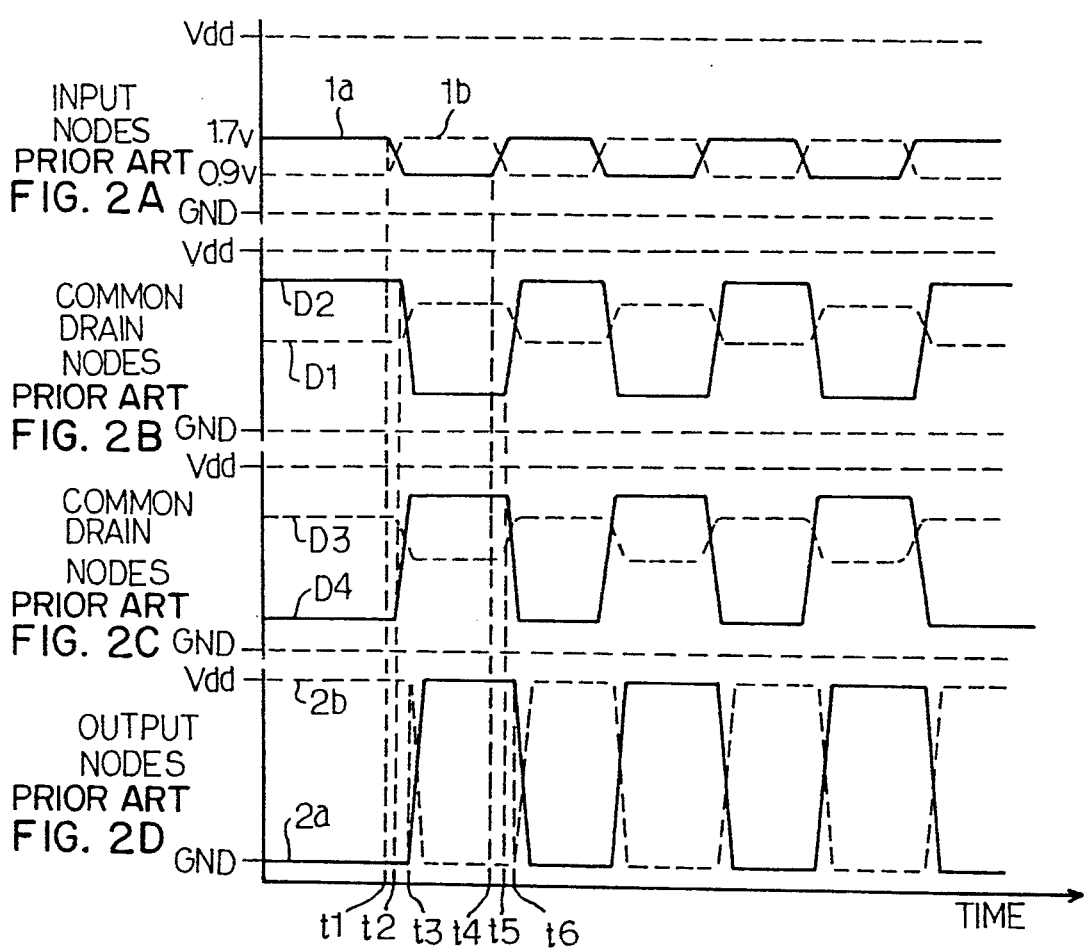
FIG. 2 is a graph showing the waveforms of the signals at the essential nodes of the prior art level shifter.

DESCRIPTION OF THE PREFERRED EMBODIMENTS First Embodiment

Referring to FIG. 3 of the drawings, a level shifter embodying the present invention largely comprises a level shifting circuit 11 and a pair of complementary inverters 12 and 13. Though not shown in the drawings, each of the complementary inverters 12 and 13 is implemented by a series combination of a p-channel enhancement type field effect transistor and an n-channel enhancement type field effect transistor, and the series combinations are connected between a positive power voltage line VDD and a ground voltage line. In this instance, the positive power voltage line VDD distributes a positive power voltage at 5.0 volts.

The level shifting circuit 11 comprises a series combination of a p-channel enhancement type field effect transistor Qp11 and an n-channel enhancement type field effect transistor Qn12 connected between the positive power voltage line VDD and an input node 14a and another series combination of a p-channel enhancement type field effect transistor Qp13 and an n-channel enhancement type field effect transistor Qn14 connected between the positive power voltage line VDD and an input node 14b. The gate electrodes of the p-channel enhancement type field effect transistors Qp11 and Qp13 are respectively-connected with the input nodes 14b and 14a, and the positive power voltage Vdd is supplied to the gate electrodes of the n-channel enhancement type field effect transistors Qn12 and Qn14.

The input node 14a is paired with the input node 14b, and complementary input signals are supplied to the pair of input nodes 14a/14b. The common drain nodes D11 and D12 are connected with the input nodes of the complementary inverters 12 and 13, and the output nodes of the complementary inverters 12 and 13 serve as a pair of output nodes 15a and 15b. Complementary output signals are delivered from the pair of output nodes 15a and 15b, and are different in voltage range from the complementary input signals. In this instance, the complementary input signals alter the voltage levels thereof between 0.9 volt and 1.7 volts, and the complementary output signals swing the voltage levels between the positive power voltage vdd and the ground voltage level GND.

The level shifter implementing the first embodiment consists of eight field effect transistors, and the circuit arrangement is simpler than that of the prior art. Moreover, the current consumption of the first embodiment is of the order of 3 milliamperes, and is less than the current consumption of the prior art at 4.8 milliamperes.

Description is hereinbelow made on the circuit behavior of the level shifter with reference to FIG. 4.

The complementary input signals start to change the voltage levels at time t11, and the input nodes 14a and 14b go up and down. The p-channel enhancement type field effect transistor Qp11 decreases the channel resistance, and the n-channel enhancement type field effect transistor Qn12 increases the channel resistance. As a result, the common drain node D11 starts the voltage level thereat to rise at time t12, and exceeds the threshold of the complementary inverter 12. The voltage level at the common drain node D11 finally reaches 3.5 volts in this instance.

On the other hand, the p-channel enhancement type field effect transistor Qp13 increases the channel resistance, and the n-channel enhancement type field effect transistor Qn14 decreases the channel resistance. As a result, the common drain node D12 starts the voltage level thereat to decay at time t12, and becomes lower than the threshold of the complementary inverter 13. The voltage level at the common drain node D12 arrives at 1.5 volts in this instance.

For this reason, the complementary inverter 12 starts the output node 15a to go down toward the ground voltage level GND at time t13, and the other complementary inverter 13 starts the associated output node 15b to go up toward the positive power voltage level Vdd.

The complementary input signals start to change the voltage levels again at time t14, and the input nodes 14a and 14b go down and up. The p-channel enhancement type field effect transistor Qp11 increases the channel resistance, and the n-channel enhancement type field effect transistor Qn12 decreases the channel resistance. As a result, the common drain node D11 starts the voltage level thereat to decay at time t15, and becomes lower than the threshold of the complementary inverter 12.

On the other hand, the p-channel enhancement type field effect transistor Qp13 decreases the channel resistance, and the n-channel enhancement type field effect transistor Qn14 increases the channel resistance. As a result, the common drain node D12 starts the voltage level thereat to rise over the threshold level of the associated complementary inverter 13 at time t15.

For this reason, the complementary inverter 12 starts the output node 15a to go up toward the positive power voltage level Vdd at time t16, and the other complementary inverter 13 starts the associated output node 15b to go down toward the ground voltage level GND.

As will be appreciated from the foregoing description, the level shifter according to the present invention decreases the number of component field effect transistors and the current consumption.

Second Embodiment

Turning to FIG. 5 of the drawings, another level shifter embodying the present invention largely comprises a level shifting circuit 21 and a pair of complementary inverters 22 and 23. The complementary inverters 22 and 23 are similar in arrangement to those of the first embodiment, and are connected between a ground voltage line and a negative power voltage line VSS. In this instance, the negative power voltage line VSS distributes a negative power voltage Vss at −5.0 volts.

The level shifting circuit 21 comprises a series combination of a p-channel enhancement type field effect transistor Qp21 and an n-channel enhancement type field effect transistor Qn22 connected between an input node 24a and the negative power voltage line VSS and another series combination of a p-channel enhancement type field effect transistor Qp23 and an n-channel enhancement type field effect transistor Qn24 connected between an input node 24b and the negative power voltage line VSS. The gate electrodes of the n-channel enhancement type field effect transistors Qn22 and Qn24 are respectively connected with the input nodes 24b and 24a, and the negative power voltage Vss is supplied to the gate electrodes of the p-channel enhancement type field effect transistors Qp21 and Qp23.

Complementary input signals are supplied to the input nodes 24a/24b, and the level shifting circuit 21 preliminarily changes the voltage range of the complementary input signals. The common drain nodes D21 and D22 are connected with the input nodes of the complementary inverters 22 and 23, and the complementary inverters 22 and 23 finally changes the voltage range of the complementary input signals. The output nodes of the complementary inverters 22 and 23 serve as a pair of output nodes 25a and 25b. Complementary output signals are delivered from the pair of output nodes 25a and 25b, and are available for a complementary inverter of the next stage. In this instance, the complementary input signals alter the voltage levels thereof between −0.9 volt and −1.7 volts, and the complementary output signals swing the voltage levels between the negative power voltage Vss and the ground voltage level GND.

The level shifter implementing the second embodiment also consists of eight field effect transistors, and the circuit arrangement is simpler than that of the prior art. Moreover, the current consumption of the second embodiment is as little as the first embodiment.

Description is hereinbelow made on the circuit behavior of the level shifter with reference to FIG. 6.

The complementary input signals start to change the voltage levels at time t21, and the input nodes 24a and 24b go up and down. The n-channel enhancement type field effect transistor Qn22 increases the channel resistance, and the p-channel enhancement type field effect transistor Qp21 decreases the channel resistance. As a result, the common drain node D21 starts the voltage level thereat to rise at time t22, and exceeds the threshold of the complementary inverter 22.

On the other hand, the n-channel enhancement type field effect transistor Qn24 decreases the channel resistance, and the p-channel enhancement type field effect transistor Qp23 increases the channel resistance. As a result, the common drain node D22 starts the voltage level thereat to decay at time t22, and becomes lower than the threshold of the complementary inverter 23.

For this reason, the complementary inverter 22 starts the output node 25a to go down toward the negative voltage level Vss at time t23, and the other complementary inverter 23 starts the associated output node 25b to go up toward the ground voltage level GND.

The complementary input signals start to change the voltage levels again at time t24, and the input nodes 24a and 24b go down and up. The n-channel enhancement type field effect transistor Qn22 decreases the channel resistance, and the p-channel enhancement type field effect transistor Qp21 increases the channel resistance. As a result, the common drain node D21 starts the voltage level thereat to decay at time t25, and becomes lower than the threshold of the complementary inverter 22.

On the other hand, the n-channel enhancement type field effect transistor Qn24 increases the channel resistance, and the p-channel enhancement type field effect transistor Qp23 decreases the channel resistance. As a result, the common drain node D22 starts the voltage level thereat to rise over the threshold level of the associated complementary inverter 23 at time t25.

For this reason, the complementary inverter 22 starts the output node 25a to go up toward the ground voltage level GND at time t26, and the other complementary inverter 23 starts the associated output node 25b to go down toward the negative voltage level Vss.

As described hereinbefore, the level shifter shown in FIG. 5 is also constituted by a smaller number of component transistors than the prior art level shifter, and the current consumption is reduced.

Although particular embodiments of the present invention have been shown and described, it will be obvious to those skilled in the art that various changes and modifications may be made without departing from the spirit and scope of the present invention.

What is claimed is:

1. A level shifter for producing complementary output signals from complementary input signals different in voltage range from said complementary output signals comprising;
    input nodes paired with each other and applied with said complementary input signals;
    output nodes paired with each other for producing said complementary output signals;

a preliminary voltage shifting circuit including a series combination of a first transistor of a first channel conductivity type, a first common node and a second transistor of a second channel conductivity type having a current path between a constant voltage source and one of said input nodes, said first channel conductivity type being opposite to said second channel conductivity type, said first transistor having a gate node connected with the other of said input nodes, said second transistor having a gate node connected with said constant voltage source, and a series combination of a third transistor of said first channel conductivity type, a second common node and a fourth transistor of said second channel conductivity type having a current path between said constant voltage source and said other of said input nodes, said third transistor having a gate node connected with said one of said input nodes, said fourth transistor having a gate node connected with said constant voltage source; and a final voltage shifting circuit connected at input nodes thereof with said first and second common nodes and at output nodes thereof with said pair of output nodes.

2. The voltage shifter as set forth in claim 1, in which said final voltage shifting circuit includes a pair of complementary inverters having respective input nodes respectively connected with said first and second common nodes and respective output nodes respectively connected with said output nodes.

3. The level shifter as set forth in claim 1, in which said first and third transistors are p-channel enhancement type field effect transistors and said second and third transistors are n-channel enhancement type field effect transistors, said constant voltage source supplying a first positive voltage level, said complementary input signals altering the voltage levels thereof between a second positive voltage level and a third positive voltage level.

4. The level shifter as set forth in claim 1, in which said first and third transistors are n-channel enhancement type field effect transistors and said second and third transistors are p-channel enhancement type field effect transistors, said constant voltage source supplying a first negative voltage level, said complementary input signals altering the voltage levels thereof between a second negative voltage level and a third negative voltage level.

5. A level shifter for producing complementary output signals from complementary input signals different in voltage range from said complementary output signals comprising;

input nodes paired with each other and applied with said complementary input signals;

output nodes paired with each other for producing said complementary output signals;

a preliminary voltage shifting circuit including a series combination of a first p-channel enhancement type field effect transistor, a first common node and a first n-channel enhancement type field effect transistor having a current path between a positive constant voltage source and one of said input nodes, said first p-channel enhancement type field effect transistor having a gate node connected with the other of said input nodes, said first n-channel enhancement type field effect transistor having a gate node connected with said positive constant voltage source, and a series combination of a second p-channel enhancement type field effect transistor, a second common node and a second n-channel enhancement type field effect transistor having a current path between said positive constant voltage source and said other of said input nodes, said second p-channel enhancement type field effect transistor having a gate node connected with said one of said input nodes, said second n-channel enhancement type field effect transistor having a gate node connected with said positive constant voltage source; and a final voltage shifting circuit connected at input nodes thereof with said first and second common nodes and at output nodes thereof with said pair of output nodes.

* * * * *